(12) United States Patent
Diot

(10) Patent No.: US 6,838,752 B2
(45) Date of Patent: Jan. 4, 2005

(54) SEMICONDUCTOR PACKAGE WITH RECESSED LEADFRAME AND A RECESSED LEADFRAME

(75) Inventor: Jean-Luc Diot, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 16 days.

(21) Appl. No.: 10/160,277

(22) Filed: May 31, 2002

(65) Prior Publication Data

US 2003/0025189 A1 Feb. 6, 2003

(30) Foreign Application Priority Data

May 31, 2001 (FR) .............................................. 01-07185

(51) Int. Cl.[7] .......................................... H01L 23/495
(52) U.S. Cl. ........................ 257/666; 257/667; 257/787
(58) Field of Search ................................ 257/666, 667, 257/676, 787

(56) References Cited

U.S. PATENT DOCUMENTS

| | | | |
|---|---|---|---|
| 4,680,613 A | | 7/1987 | Daniels et al. |
| 6,011,303 A | | 1/2000 | Tanaka et al. |
| 6,025,640 A | | 2/2000 | Yagi et al. |
| 6,452,255 B1 | * | 9/2002 | Bayan et al. ................ 257/666 |

FOREIGN PATENT DOCUMENTS

| | | |
|---|---|---|
| EP | 0 989 608 A2 | 3/2000 |
| JP | 62098751 | 5/1987 |
| JP | 08306853 | 11/1996 |

OTHER PUBLICATIONS

Cha, K.B. et al. Ultra–Thin and Crack–Free Bottom Leaded Plastic (BLP) Package Design, *IEEE, Proceedings of the Electronic Components and Technology Conference*, XP000624973, vol. Conf. 45, May 21, 1995, pp. 224–228.

French Preliminary Search Report dated Apr. 17, 2002 for French Patent Application No. 0107185.

* cited by examiner

*Primary Examiner*—Roy Potter
(74) *Attorney, Agent, or Firm*—Lisa K. Jorgenson; Stephen Bongini; Fleit, Kain, Gibbons, Gutman, Bongini & Bianco P.L.

(57) ABSTRACT

A semiconductor package is provided that includes a flat leadframe having front and rear faces. The leadframe includes a central platform and elongate electrical connection leads distributed around this platform. Electrical connection wires connect the chip to the front face of the leads, and encapsulation means encapsulates the chip such that the rear face of the leadframe is visible. The electrical connection leads include an inner end part and an outer end part, the rear faces of the inner and outer end parts lie in the plane of the rear face of the leadframe, and the inner and outer end parts are connected by a branch whose rear face is set back with respect to the plane of the rear face of the leadframe so as to define a rear recess. The electrical connection wires are connected to the leads on the front face of their inner end part.

21 Claims, 4 Drawing Sheets

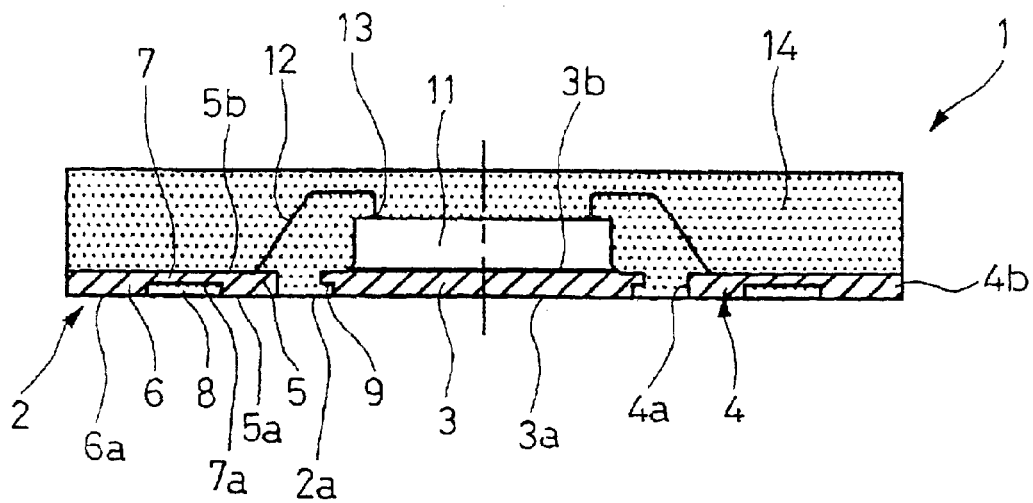
FIG_1
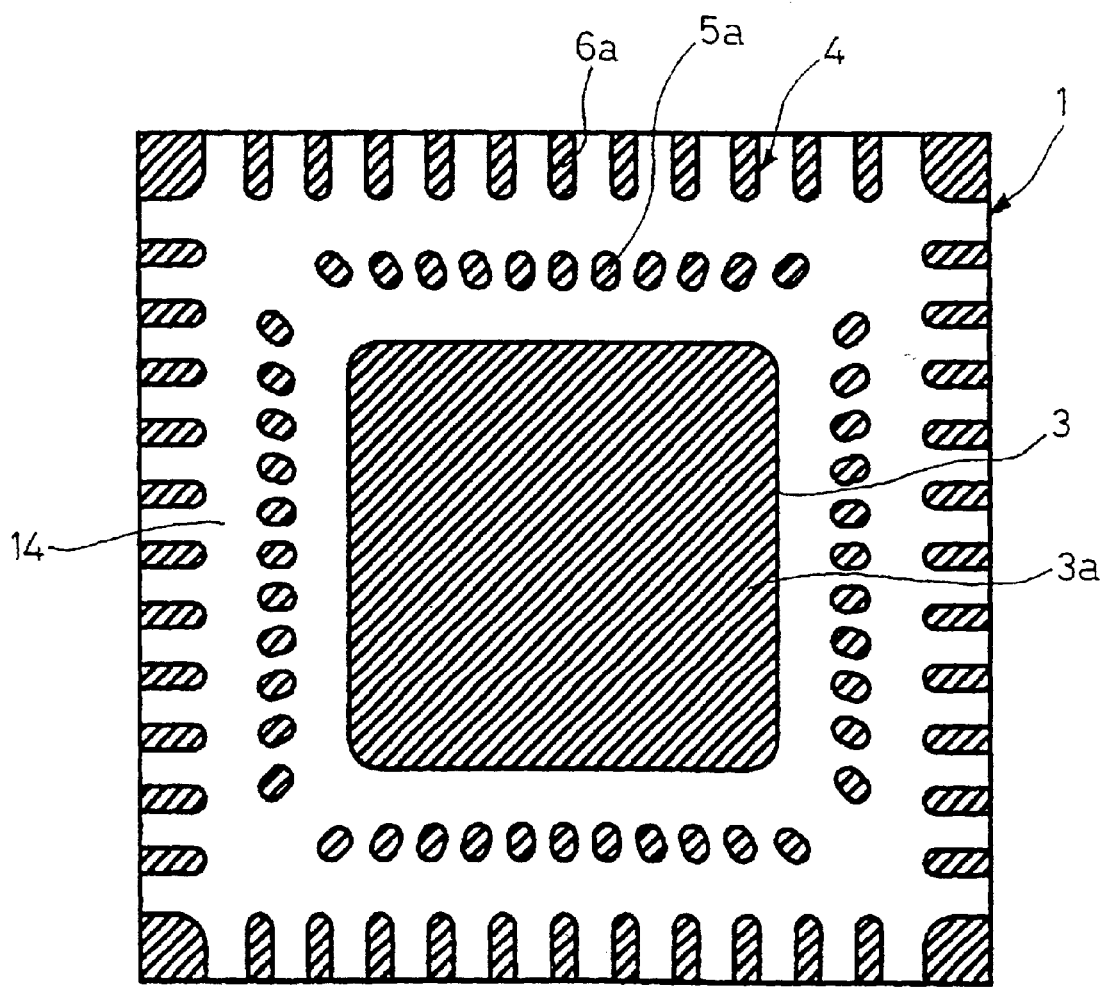
FIG_2

FIG_3
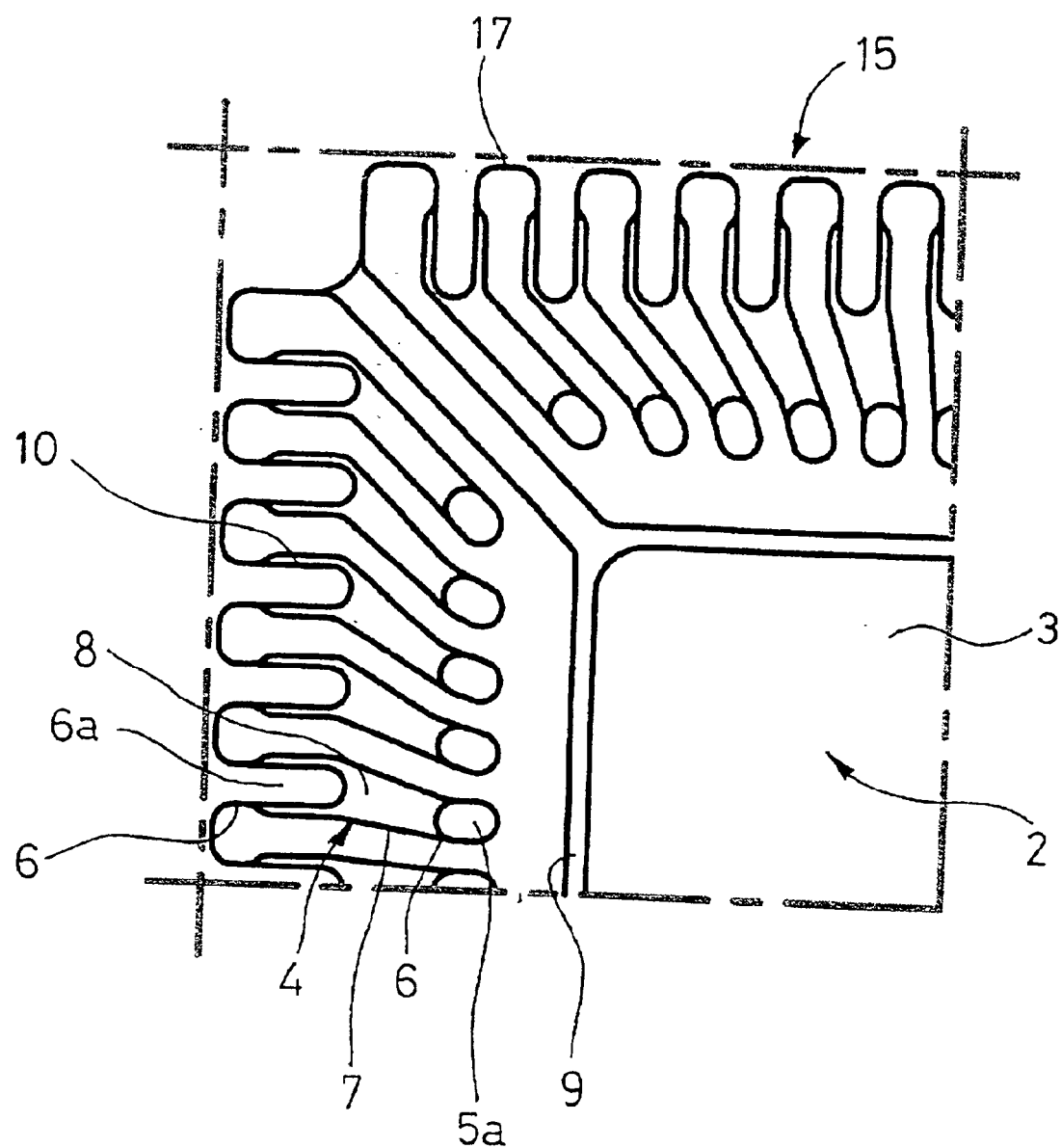

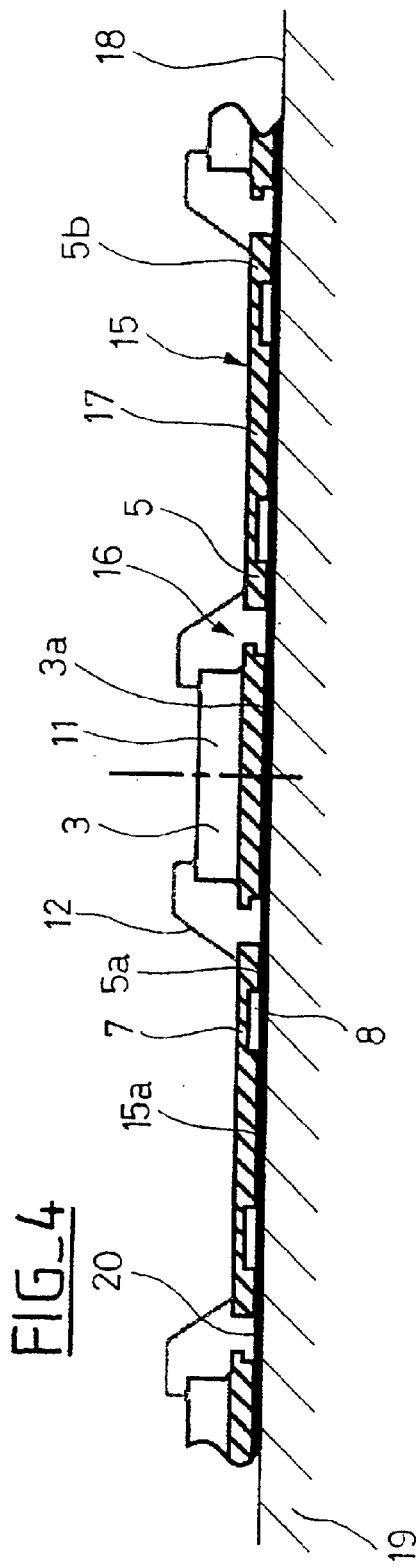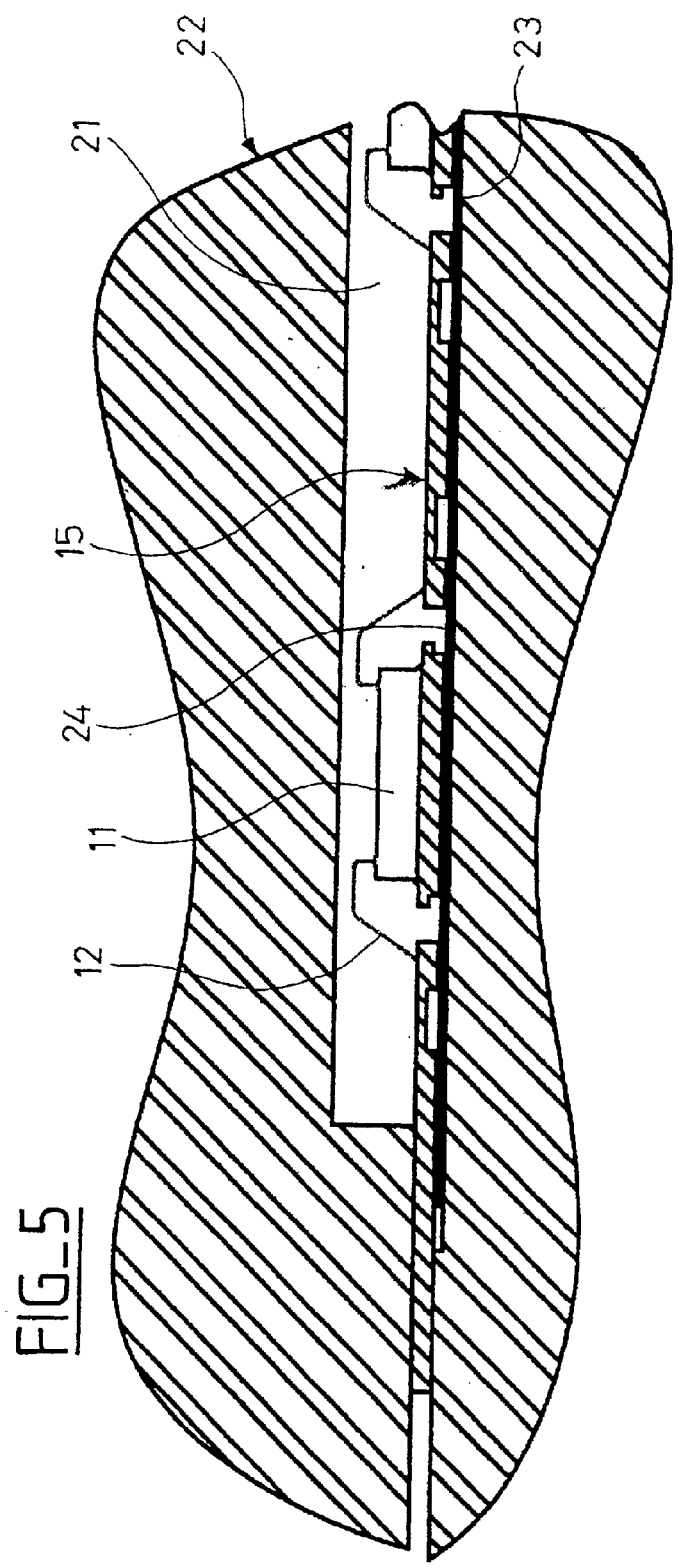
FIG_4
FIG_5

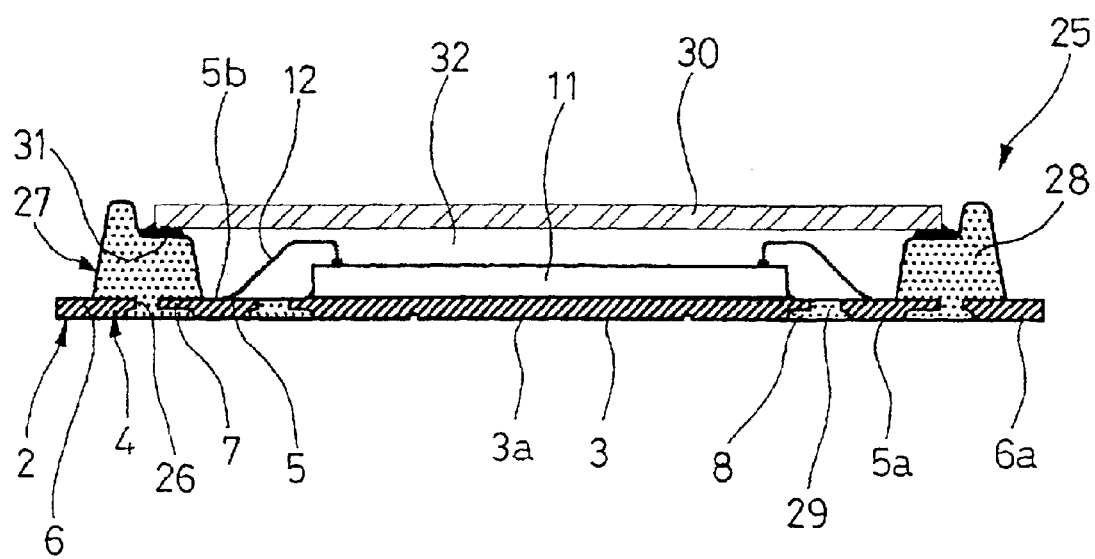
FIG_6

SEMICONDUCTOR PACKAGE WITH RECESSED LEADFRAME AND A RECESSED LEADFRAME

CROSS-REFERENCE TO RELATED APPLICATIONS

This application is based upon and claims priority from prior French Patent Application No. 01-07185, filed May 31, 2001, the entire disclosure of which is herein incorporated by reference.

BACKGROUND OF THE INVENTION

1. Field of the Invention

The present invention relates to semiconductor packages, and more specifically to a semiconductor package having a recessed leadframe.

2. Description of Related Art

One type of conventional semiconductor package has a leadframe made of an electrically conductive material. The leadframe includes a platform on the front face of which an integrated circuit chip is fastened and peripheral leads, the front faces of which are connected to the chip by electrical connection wires. This assembly is encapsulated, for example, in a thermosetting resin, in such a way that the rear face of the leadframe is visible so that the rear faces of the leads can be connected to the outside.

When it is desired to fasten a chip of small dimensions to the platform of the leadframe, it is necessary to provide electrical connection wires of increased length. This increase in the length of the electrical connection wires results in an increase in parasitic electrical resistance. To limit this parasitic electrical resistance, provision may be made to reduce the area of the platform and to extend the electrical connection leads inwards. However, such an arrangement causes difficulties in anchoring the electrical connection leads in the encapsulating resin and does not ensure that the rear faces of the leads have a small boundary, on which rear faces the external electrical connections will subsequently be made.

SUMMARY OF THE INVENTION

In view of these drawbacks, it is an object of the present invention to provide a semiconductor package and an electrical connection leadframe that allow the above-mentioned drawbacks to be limited.

One embodiment of the present invention provides a semiconductor package that includes a flat leadframe, an integrated circuit chip, electrical connection wires, and encapsulation means. The flat leadframe is made of an electrically conductive material. The leadframe includes a central platform and elongate electrical connection leads distributed around the platform. Each of the electrical connection leads has an inner end located on the side towards the chip and an outer end. The integrated circuit chip is fastened to the front face of the platform, and each of the electrical connection wires connects the integrated circuit chip to the front face of one of the electrical connection leads. The encapsulation means encapsulates the integrated circuit chip such that the rear face of the leadframe is visible. Additionally, at least one of the electrical connection leads includes an inner end part and an outer end part, the rear faces of the inner and outer end parts lie in the plane of the rear face of the leadframe, the inner and outer end parts are connected by a branch whose rear face is set back with respect to the plane of the rear face of the leadframe so as to define a rear recess, and one of the electrical connection wires is connected to the at least one electrical connection lead on the front face of the inner end part of the at least one electrical connection lead.

Another embodiment of the present invention provides a flat leadframe made of an electrically conductive material. The leadframe includes a central platform and elongate electrical connection leads distributed around the platform. Each of the electrical connection leads has an inner end located on the side towards the chip and an outer end. At least one of the electrical connection leads includes an inner end part and an outer end part, the rear faces of the inner and outer end parts lie in the plane of the rear face of the leadframe, and the inner and outer end parts are connected by a branch whose rear face is set back with respect to the plane of the rear face of the leadframe so as to define a rear recess.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 1 shows a cross section through a semiconductor package according to a preferred embodiment of the present invention;

FIG. 2 shows a rear view of the semiconductor package of FIG. 1;

FIG. 3 shows a partial rear view of the leadframe of the semiconductor package of FIG. 1;

FIG. 4 shows a cross section through several semiconductor packages corresponding to the semiconductor package of FIG. 1 at point during manufacturing;

FIG. 5 shows a cross section through several semiconductor packages corresponding to the semiconductor package of FIG. 1 at another point during manufacturing; and FIG. 6 shows a cross section through a semiconductor package according to another embodiment of the present invention.

DETAILED DESCRIPTION OF PREFERRED EMBODIMENTS

Preferred embodiments of the present invention will be described in detail hereinbelow with reference to the attached drawings.

Preferred embodiments of the present invention provide a semiconductor package which comprises a flat leadframe made of an electrically conductive material having a front face and a rear face. The leadframe includes a central platform and elongate electrical connection leads distributed around this platform and has an inner end located on the side towards the chip and an outer end. An integrated circuit chip is fastened to the front face of the platform, electrical connection wires connect the chip to the front face of the leads, and encapsulation means is provided such that the rear face of the leadframe is visible.

Further, the electrical connection leads include an inner end part and an outer end part, the rear faces of which lie in the plane of the rear face of the leadframe. The end parts are connected by a branch, the rear face of which is set back with respect to the plane of the rear face of the leadframe so as to define a rear recess, and the electrical connection wires are connected to the leads on the front face of their inner end part.

Preferably, the encapsulation means is an encapsulating material which extends from the rear face of the leadframe, at least between the leads and between these leads and the platform. According to one embodiment, the leads include a passage through which the encapsulating material extends.

According to another embodiment, the encapsulating material constitutes, in front of the leadframe, a block in which the chip and the electrical connection wires are embedded. According to yet another embodiment of the present invention, the encapsulating material constitutes, in front of the leadframe, a protruding ring extending outside the region where the electrical wires are bonded to the inner end parts of the leads and it includes a plate, the periphery of which is fastened to the front part of the ring so as to form a cavity between this plate and the leadframe. In embodiments of the present invention, the leads and the platform preferably have, over at least part of the periphery of their rear faces, chamfered or indented edges.

The present invention also provides a flat leadframe made of an electrically conductive material having a front face and a rear face. The leadframe includes a central platform and elongate leads distributed around this platform and has an inner end located on the side towards the chip and an outer end. Further, the electrical connection leads include an inner end part and an outer end part, the rear faces of which lie in the plane of the rear face of the leadframe, which end parts are connected by a branch, the rear face of which is set back with respect to the plane of the rear face of the leadframe so as to define a rear recess. Preferably, the leads and the platform have, over at least part of the periphery of their rear faces, chamfered or indented edges. According to one embodiment, the branches of the leads have through-passages or through-holes.

Exemplary embodiments of the present invention will now be described in detail with reference to FIGS. 1–6. FIGS. 1 to 3 show a semiconductor package 1 which includes a flat leadframe 2 made of an electrically conductive material (for example, a metal) The leadframe has, in its central part, a square platform 3 and a multiplicity of elongate electrical connection leads 4 which are distributed around the platform.

These elongate electrical connection leads 4 are at a certain distance apart and are placed at a certain distance from the platform 3 so as to have an inner end 4a located on the side towards the platform 3 and an outer end 4b. The inner ends 4a lie on a square located at a certain distance from the periphery of the platform 3 and the outer ends 4b lie on an outer square.

The electrical connection leads 4 have, respectively, an inner end part 5 located on the side towards the platform 3 or adjacent to their inner end 4a, an outer end part 6 at a certain distance from their inner parts 5 and adjacent to their outer end 4b, and a branch 7 which connects their inner end part 5 to their outer end part 6.

The inner end parts 5 and the outer end parts 6 of the electrical connection leads 4 have rear faces 5a and 6a, respectively, which lie in the rear plane 2a of the leadframe 2, and the branches 7 have rear faces 7a set back with respect to the rear plane 2a of the leadframe 2 so as to form rear recesses 8. The rear face 3a of the platform 3 also lies in the rear plane 2a of the leadframe 2. The platform 3 and the outer parts 6 of the electrical connection leads 4 have, around the periphery of their rear faces lying in the rear plane 2a of the leadframe 2, chamfered or indented edges 9 and 10.

The semiconductor package 1 also includes an integrated circuit chip 11, the rear face of which is fastened to the front face 3b of the platform 3 of the leadframe 2, and electrical connection wires 12. One end of the electrical connection wires 12 is bonded to pads 13 on the front face of the chip 11, and the other ends of the wires are bonded to the front face 5b of the inner parts 5 of the electrical connection leads 4.

The semiconductor package 1 furthermore includes an encapsulation block 14 made of an encapsulating material (for example, a thermosetting resin). This encapsulation block 14 defines a parallelepiped which lies in front of the rear face 2a of the leadframe 2 so as to embed this leadframe 2, the chip 11, and the electrical connection wires 12, in such a way that the rear face 3a of the platform 3 and the rear faces 5a and 6a of the inner and outer parts 5 and 6 of the electrical connection leads 4 are apparent or visible.

As a result, the encapsulation block fills the spaces separating the platform 3 from the electrical connection leads 4, the spaces between the electrical connection leads 4, the rear recesses 8 of the electrical connection leads 4 and the chamfered or indented edges 9 and 10 of the platform 3 and of the electrical connection leads 4 in such a way that the leadframe 2 is held in place or anchored firmly. Thus, the rear faces 6a of the outer parts 6 of the electrical connection leads 4 of the leadframe 2 are of small size and can advantageously be used to make the external electrical connections of the semiconductor package 1.

FIGS. 3 and 4 show a metal plate 15 which includes a multiplicity of regions 16 corresponding to the leadframe 2 and connected together by strips 17. The rear face 15a of the plate 15 is fastened to a flat surface 18 of a support 19 by an adhesive tape 20, in such a way that the rear faces 3a of the platforms 3 and the rear faces 5a and 6a of the inner and outer parts 5 and 6 of the electrical connection leads 4 of the various leadframes 2 formed in the regions 16 bear on the surface 18 of the support 19 via the adhesive tape 20.

With the plate 15 thus installed and held in place, it is then possible to fasten the various chips 11 to the various platforms 3 and bond the ends of the various electrical connection wires 12, without the platforms 3 and the inner parts 5 of the electrical connection leads moving.

Thereafter, as shown in FIG. 5, it is possible to place the leadframe 15 provided with the various chips 11 and with the various electrical connection wires 12 into the cavity 21 of an injection mold 22, by fastening the rear face 15a against a surface 23 of the cavity 21, again by using an adhesive tape 24. Next, an encapsulating material is injected into the cavity 21 of the mold 22, which fills this cavity up to the rear face 15a of the leadframe 15. After demolding, the molded block can be sawn up, removing the strips 17 so as to obtain a multiplicity of semiconductor packages 1 as described above and corresponding respectively to the various regions 16 of the plate 15.

FIG. 6 shows a semiconductor package according to another embodiment of the present invention. As shown, the semiconductor package 25 includes, like the semiconductor package 1 of FIG. 1, a leadframe 2, an integrated circuit chip 11, and electrical connection wires 12. The branches 7 of the electrical connection leads 4 furthermore have through-passages 26.

The semiconductor package 25 of FIG. 6 differs from the semiconductor package 1 of FIG. 1 by the fact that it has an encapsulation block 27 made of an encapsulating material which forms a protruding ring 28 lying in front of the front face of the leadframe 2, around and at a certain distance from the regions where the electrical connection wires 12 are bonded to the front faces 5b of the inner parts 5 of the electrical connection leads 4 and of the filling parts 29.

The encapsulation block 27 made of an encapsulating material also fills, in the thickness of the leadframe 2, the spaces separating the electrical connection leads 4 from the platform 3, the spaces separating the electrical connection leads, the rear recesses 8 of the electrical connection leads and the through-holes 26 in order to connect the material filling the recesses 8 and the ring 28. The semiconductor package 25 furthermore includes a front encapsulation plate 30, the periphery of which is fastened to a front face 31 of the ring 28 by means of an adhesive, so as to define a cavity 32 containing the chip 11 and the electrical connection wires 12.

To fabricate the semiconductor package 25 of FIG. 6, the encapsulation block 27 is first produced on the leadframe 2. Next, the chip 11 is fastened and the ends of the electrical connection wires 12 are bonded, as described above. Then, the encapsulation plate 30 is fitted.

Of course, it is also possible to fit the leadframe 15 described with reference to FIG. 4, to produce in a single molding operation encapsulation blocks 25 on the various regions 16, to fasten chips 11 to the various platforms 3, to bond the electrical connection wires 12 to the various chips 11 and the inner parts 5 of the various electrical connection leads 4, respectively, to fasten various plates 30 to the various rings 28 and, then, to cut the plate 15 so as to remove the strips 17. In this way, various semiconductor packages 25 corresponding to the various regions 16 are obtained.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A semiconductor package comprising:
    a flat leadframe made of an electrically conductive material, the leadframe having a front face and a rear face, the leadframe including a central platform and a plurality of elongate electrical connection leads distributed around the platform, each of the electrical connection leads having an inner end located on the side towards the chip and an outer end;
    an integrated circuit chip fastened to the front face of the platform;
    a plurality of electrical connection wires, each of the electrical connection wires connecting the integrated circuit chip to the front face of one of the electrical connection leads; and
    encapsulation means encapsulating the integrated circuit chip such that the rear face of the leadframe is visible,
    wherein at least one of the electrical connection leads includes an inner end part and an outer end part, the rear faces of the inner and outer end parts lie in the plane of the rear face of the leadframe, the inner and outer end parts are connected by a branch whose rear face is set back with respect to the plane of the rear face of the leadframe so as to define a rear recess, and one of the electrical connection wires is connected to the at least one electrical connection lead on the front face of the inner end part of the at least one electrical connection lead, and
    the at least one electrical connection lead includes a through-passage or through-hole.

2. The semiconductor package according to claim 1, wherein the encapsulation means includes an encapsulating material that extends from the rear face of the leadframe, at least between the leads and between the leads and the platform.

3. The semiconductor package according to claim 2, wherein the encapsulating material extends through the through-passage or through-hole in the at least one electrical connection lead.

4. The semiconductor package according to claim 2, wherein the encapsulating material forms a block in front of the leadframe in which the chip and the electrical connection wires are embedded.

5. A semiconductor package comprising:
    a flat leadframe made of an electrically conductive material, the leadframe having a front face and a rear face, the leadframe including a central platform and a plurality of elongate electrical connection leads distributed around the platform, each of the electrical connection leads having an inner end located on the side towards the chip and an outer end;
    an integrated circuit chip fastened to the front face of the platform;
    a plurality of electrical connection wires, each of the electrical connection wires connecting the integrated circuit chip to the front face of one of the electrical connection leads; and
    encapsulation means encapsulating the integrated circuit chip such that the rear face of the leadframe is visible,
    wherein at least one of the electrical connection leads includes an inner end part and an outer end part, the rear faces of the inner and outer end parts lie in the plane of the rear face of the leadframe, the inner and outer end parts are connected by a branch whose rear face is set back with respect to the plane of the rear face of the leadframe so as to define a rear recess, and one of the electrical connection wires is connected to the at least one electrical connection lead on the front face of the inner end part of the at least one electrical connection lead,
    the encapsulation means includes an encapsulating material, and
    the encapsulating material forms a protruding ring in front of the leadframe, the ring extending outside the region where the electrical connection wires are bonded to the inner end parts of the leads.

6. The semiconductor package according to claim 5, wherein the encapsulation means further includes a plate whose periphery is fastened to the front part of the ring so as to form a cavity between the plate and the leadframe.

7. A semiconductor package comprising:
    a flat leadframe made of an electrically conductive material, the leadframe having a front face and a rear face, the leadframe including a central platform and a plurality of elongate electrical connection leads distributed around the platform, each of the electrical connection leads having an inner end located on the side towards the chip and an outer end;

an integrated circuit chip fastened to the front face of the platform;

a plurality of electrical connection wires, each of the electrical connection wires connecting the integrated circuit chip to the front face of one of the electrical connection leads; and encapsulation means encapsulating the integrated circuit chip such that the rear face of the leadframe is visible, wherein at least one of the electrical connection leads includes an inner end part and an outer end part, the rear faces of the inner and outer end parts lie in the plane of the rear face of the leadframe, the inner and outer end parts are connected by a branch whose rear face is set back with respect to the plane of the rear face of the leadframe so as to define a rear recess, and one of the electrical connection wires is connected to the at least one electrical connection lead on the front face of the inner end part of the at least one electrical connection lead, and the leads and the platform have chamfered or indented edges over at least part of the periphery of their rear faces.

8. A flat leadframe made of an electrically conductive material, the leadframe having a front face and a rear face, the leadframe comprising:

a central platform; and elongate electrical connection leads distributed around the platform, each of the electrical connection leads having an inner end located on the side towards the chip and an outer end, wherein at least one of the electrical connection leads includes an inner end part and an outer end part, the rear faces of the inner and outer end parts lie in the plane of the rear face of the leadframe, and the inner and outer end parts are connected by a branch whose rear face is set back with respect to the plane of the rear face of the leadframe so as to define a rear recess, and the leads and the platform have chamfered or indented edges over at least part of the periphery of their rear faces.

9. A flat leadframe made of an electrically conductive material, the leadframe having a front face and a rear face, the leadframe comprising:

a central platform; and elongate electrical connection leads distributed around the platform, each of the electrical connection leads having an inner end located on the side towards the chip and an outer end, at least one of the electrical connection leads includes an inner end part and an outer end part, the rear faces of the inner and outer end parts lie in the plane of the rear face of the leadframe, and the inner and outer end parts are connected by a branch whose rear face is set back with respect to the plane of the rear face of the leadframe so as to define a rear recess, and the branch of the at least one of the electrical connection lead has a through-passage or through-hole.

10. The semiconductor package according to claim 1, wherein the through-passage or through-hole is located in the branch of the at least one electrical connection lead.

11. The semiconductor package according to claim 1, wherein the encapsulation means includes an encapsulating material, and the encapsulating material extends through the through-passage or through-hole in the at least one electrical connection lead.

12. An electronic device including at least one semiconductor package according to claim 1.

13. The semiconductor package according to claim 5,
wherein each of the electrical connection leads includes a through-passage or through-hole, and
the ring covers the through-passages or through-holes in the electrical connection leads.

14. The semiconductor package according to claim 5, wherein the at least one electrical connection lead includes a through-passage or through-hole that is located below the ring.

15. The semiconductor package according to claim 5,
wherein the at least one electrical connection lead includes a through-passage or through-hole, and
the encapsulating material fills the rear recess of the at least one electrical connection lead and the through-passage or through-hole in the at least one electrical connection lead, so as to connect the encapsulating material filling the recess and the ring.

16. An electronic device including at least one semiconductor package according to claim 5.

17. An electronic device including at least one semiconductor package according to claim 7.

18. A semiconductor package including at least one leadframe according to claim 8.

19. An electronic device including at least one semiconductor package according to claim 18.

20. A semiconductor package including at least one leadframe according to claim 9.

21. An electronic device including at least one semiconductor package according to claim 20.

* * * * *

US006838752C1

(12) EX PARTE REEXAMINATION CERTIFICATE (9306th)
United States Patent
Diot

(10) Number: US 6,838,752 C1
(45) Certificate Issued: Sep. 18, 2012

(54) SEMICONDUCTOR PACKAGE WITH RECESSED LEADFRAME AND A RECESSED LEADFRAME

(75) Inventor: Jean-Luc Diot, Grenoble (FR)

(73) Assignee: STMicroelectronics, Inc., Carrollton, TX (US)

Reexamination Request:
No. 90/011,638, Apr. 8, 2011

Reexamination Certificate for:
Patent No.: 6,838,752
Issued: Jan. 4, 2005
Appl. No.: 10/160,277
Filed: May 31, 2002

(30) Foreign Application Priority Data

May 31, 2001 (FR) .......................................... 01-07185

(51) Int. Cl.
 *H01L 23/495* (2006.01)

(52) U.S. Cl. .......................... 257/666; 257/667; 257/787
(58) Field of Classification Search .................. None
 See application file for complete search history.

(56) References Cited

To view the complete listing of prior art documents cited during the proceeding for Reexamination Control Number 90/011,638, please refer to the USPTO's public Patent Application Information Retrieval (PAIR) system under the Display References tab.

*Primary Examiner* — Leonardo Andujar

(57) ABSTRACT

A semiconductor package is provided that includes a flat leadframe having front and rear faces. The leadframe includes a central platform and elongate electrical connection leads distributed around this platform. Electrical connection wires connect the chip to the front face of the leads, and encapsulation means encapsulates the chip such that the rear face of the leadframe is visible. The electrical connection leads include an inner end part and an outer end part, the rear faces of the inner and outer end parts lie in the plane of the rear face of the leadframe, and the inner and outer end parts are connected by a branch whose rear face is set back with respect to the plane of the rear face of the leadframe so as to define a rear recess. The electrical connection wires are connected to the leads on the front face of their inner end part.

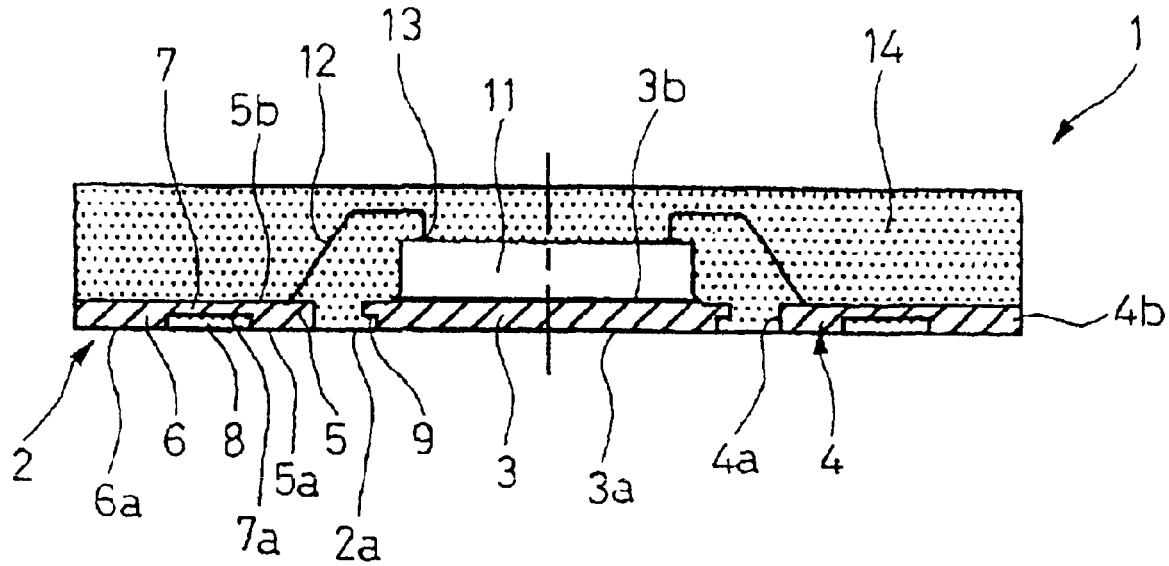

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-21 is confirmed.

New claims 22-63 are added and determined to be patentable.

22. *The semiconductor package according to claim 1, wherein at least another one of the electrical connection leads includes a second inner end part and a second outer end part, the rear faces of the second inner and outer end parts lie in the plane of the rear face of the leadframe, the second inner and outer end parts are connected by a second branch whose rear face is set back with respect to the plane of the rear face of the leadframe so as to define a second rear recess, wherein the branch is inclined at a first acute angle relative to the second branch.*

23. *The semiconductor package according to claim 22, wherein at least another one of the electrical connection leads includes a third inner end part and a third outer end part, the rear faces of the third inner and outer end parts lie in the plane of the rear face of the leadframe, the third inner and outer end parts are connected by a third branch whose rear face is set back with respect to the plane of the rear face of the leadframe so as to define a third rear recess, wherein the branch is inclined at a second acute angle relative to the third branch.*

24. *The semiconductor package according to claim 23, wherein the first acute angle is about equal but opposite to the second acute angle.*

25. *The semiconductor package according to claim 24, wherein the branch, the second branch, and the third branch all extend from the same side of the integrated circuit chip.*

26. *The semiconductor package according to claim 1, wherein at least another one of the electrical connection leads includes a second inner end part and a second outer end part, the rear faces of the second inner and outer end parts lie in the plane of the rear face of the leadframe, the second inner and outer end parts are connected by a second branch whose rear face is set back with respect to the plane of the rear face of the leadframe so as to define a second rear recess, wherein the branch is longer than the second branch.*

27. *The semiconductor package according to claim 5, wherein the electrical connection leads include a group of electrical connection leads arranged along an edge of the integrated circuit chip, the group including a central connection lead with a central branch that is substantially perpendicular to the edge of the integrated circuit chip, a first end connection lead with a first branch that extends from the integrated circuit chip at a positive acute angle relative to the central connection lead, and a second end connection lead with a second branch that extends from the integrated circuit chip at a negative acute angle relative to the central connection lead, and wherein each of the electrical connection leads includes the inner end part and the outer end part.*

28. *The semiconductor package according to claim 7, wherein, for the at least one electrical connection lead, the branch extends across an entire width of the electrical connection lead so that the recess fully separates the inner part from the outer part, wherein the branch extends along the length of the electrical connection lead between the inner part and the outer part.*

29. *The semiconductor package according to claim 7, wherein the electrical connection leads include a group of electrical connection leads arranged along an edge of the integrated circuit chip, the group including a central connection lead with a central branch that is substantially perpendicular to the edge of the integrated circuit chip, a first end connection lead with a first branch that extends from the integrated circuit chip at a positive acute angle relative to the central connection lead, and a second end connection lead with a second branch that extends from the integrated circuit chip at a negative acute angle relative to the central connection lead.*

30. *The semiconductor package according to claim 29, wherein the group of electrical connection leads further includes a second central connection lead disposed between the central connection lead and the first end connection lead and a third central connection lead disposed between the central connection lead and the second end connection lead.*

31. *The semiconductor package according to claim 29, wherein a second group of the electrical connection leads are arranged along a second edge of the integrated circuit chip, the second edge being perpendicular to and adjoining the edge, the second group including a second central connection lead that extends from the integrated circuit chip at an acute angle relative to the second end connection lead.*

32. *The semiconductor package according to claim 31, wherein the second central connection lead includes a second central branch that is substantially perpendicular to the second edge of the integrated circuit chip and wherein the second group further comprises a third end connection lead that extends from the integrated circuit chip at a positive acute angle relative to the second central connection lead and a fourth end connection lead that extends from the integrated circuit chip at a negative acute angle relative to the second central connection lead.*

33. *The semiconductor package according to claim 29, wherein the first branch of the first end connection lead is longer than the central branch of the central connection lead and the second branch of the second end connection lead is longer than the central branch of the central connection lead.*

34. *The semiconductor package according to claim 33, wherein the first branch of the first end connection lead is the same length as the second branch of the second end connection lead.*

35. *The semiconductor package according to claim 7, wherein the electrical connection leads include a group of electrical connection leads arranged along an edge of the integrated circuit chip, the group including a first connection lead with a first branch having a first length and a second connection lead with a second branch having a second length, the first length being different than the second length.*

36. *The semiconductor package according to claim 35, wherein the electrical connection leads include a second group of electrical connection leads arranged along a second edge of the integrated circuit chip, the second group including a third connection lead with a third branch having the first length and a fourth connection lead with a fourth branch having the second length.*

37. *The semiconductor package according to claim 7, wherein the encapsulation means includes substantially ver-* tical sidewalls that are substantially perpendicular to an upper surface of the flat leadframe.

38. The semiconductor package according to claim 7, wherein the at least one of the leads has a chamfered edge and the platform has an indented edge.

39. The flat leadframe according to claim 8, wherein, for the at least one electrical connection lead, the branch extends across an entire width of the electrical connection lead so that the recess fully separates the inner part from the outer part, wherein the branch extends along the length of the electrical connection lead between the inner part and the outer part.

40. The flat leadframe according to claim 8, wherein the at least one of the leads has a chamfered edge and the platform has an indented edge.

41. The flat leadframe according to claim 8, wherein the electrical connection leads include a group of electrical connection leads arranged along an edge of the central platform, the group including a central connection lead with a central branch that is substantially perpendicular to the edge of the central platform, a first end connection lead with a first branch that extends from the central platform at a positive acute angle relative to the central connection lead, and a second end connection lead with a second branch that extends from the central platform at a negative acute angle relative to the central connection lead.

42. The flat leadframe according to claim 41, wherein the group of electrical connection leads further includes a second central connection lead disposed between the central connection lead and the first end connection lead and a third central connection lead disposed between the central connection lead and the second end connection lead.

43. The flat leadframe according to claim 41, wherein a second group of the electrical connection leads are arranged along a second edge of the central platform, the second edge being perpendicular to and adjoining the edge, the second group including a second central connection lead that extends from the central platform at an acute angle relative to the second end connection lead.

44. The flat leadframe according to claim 43, wherein the second central connection lead includes a second central branch that is substantially perpendicular to the second edge of the central platform and wherein the second group further comprises a third end connection lead that extends from the central platform at a positive acute angle relative to the second central connection lead and a fourth end connection lead that extends from the central platform at a negative acute angle relative to the second central connection lead.

45. The flat leadframe according to claim 41, wherein the first branch of the first end connection lead is longer than the central branch of the central connection lead and the second branch of the second end connection lead is longer than the central branch of the central connection lead.

46. The flat leadframe according to claim 45, wherein the first branch of the first end connection lead is the same length as the second branch of the second end connection lead.

47. The flat leadframe according to claim 8, wherein the electrical connection leads include a group of electrical connection leads arranged along an edge of the central platform, the group including a first connection lead with a first branch having a first length and a second connection lead with a second branch having a second length, the first length being different than the second length.

48. The flat leadframe according to claim 47, wherein the electrical connection leads include a second group of electrical connection leads arranged along a second edge of the central platform, the second group including a third connection lead with a third branch having the first length and a fourth connection lead with a fourth branch having the second length.

49. The flat leadframe according to claim 9, wherein each of the electrical connection leads includes the inner end part and the outer end part, and wherein at least one branch with the through-passage or the through hole is located in a central portion of the rear recess of the leadframe.

50. A semiconductor package comprising:
 a flat leadframe made of an electrically conductive material, the leadframe having a front face and a rear face, the leadframe comprising a central platform, and a plurality of elongate electrical connection leads distributed around the platform;
 an integrated circuit chip fastened to the front face of the platform, wherein each of the electrical connection leads has an inner end located on the side towards the chip and an outer end;
 an encapsulation material surrounding the integrated circuit chip such that the rear face of the leadframe is visible, the encapsulation material including substantially vertical sidewalls that are substantially perpendicular to an upper surface of the flat leadframe; and
 a plurality of electrical connection wires, each of the electrical connection wires connecting the integrated circuit chip to the inner end of one of the electrical connection leads;
 wherein the electrical connection leads include a group of electrical connection leads arranged along an edge of the integrated circuit chip, the group including a central connection lead with a central branch that is substantially perpendicular to the edge of the integrated circuit chip, a first end connection lead with a first branch that extends from the edge of the integrated circuit chip at a positive acute angle relative to the central connection lead, and a second end connection lead with a second branch that extends from the edge of the integrated circuit chip at a negative acute angle relative to the central connection lead,
 wherein each of the electrical connection leads includes an inner end part and an outer end part, the rear faces of the inner and outer end parts lying in the plane of the rear face of the leadframe, wherein in inner and outer end parts are connected by a branch whose rear face is set back with respect to the plane of the rear face of the leadframe so as to define a rear recess, and
 wherein the leads and the platform have chamfered or indented edges over at least part of the periphery of their rear faces such that at least one of the leads has a chamfered edge and the platform has an indented edge.

51. The semiconductor package according to claim 50, wherein, for each electrical connection lead, the recess fully separates the inner part from the outer part.

52. The semiconductor package according to claim 50, wherein the group of electrical connection leads further includes a second central connection lead disposed between the central connection lead and the first end connection lead and a third central connection lead disposed between the central connection lead and the second end connection lead.

53. The semiconductor package according to claim 52, wherein a second group of the electrical connection leads are arranged along a second edge of the integrated circuit chip, the second edge being perpendicular to and adjoining the edge, the second group including a second central connection lead that extends from the integrated circuit chip at an acute angle relative to the second end connection lead.

54. The semiconductor package according to claim 53, wherein the second central connection lead includes a second central branch that is substantially perpendicular to the second edge of the integrated circuit chip and wherein the second group further comprises a third end connection lead that extends from the integrated circuit chip at a positive acute angle relative to the second central connection lead and a fourth end connection lead that extends from the integrated circuit chip at a negative acute angle relative to the second central connection lead.

55. A method of forming a semiconductor device, the method comprising:

provIding a structure that includes a plurality of flat leadframes made of an electrically conductive material and arranged adjacent each other, each leadframe of the plurality of leadframes having a front face and a rear face, each leadframe of the plurality of leadframes comprising a central platform and elongate electrical connection leads distributed around the platform, each of the electrical connection leads having an inner end located on the side towards a chip location and an outer end, wherein at least one of the electrical connection leads includes an inner end part and an outer end part, the rear faces of the inner and outer end parts lie in the plane of the rear face of the leadframe, and the inner and outer end parts are connected by a branch whose rear face is set back with respect to the plane of the rear face of the leadframe so as to define a rear recess, and the leads and the platform have chamfered or indented edges over at least part of the periphery of their rear faces;

fastening a plurality of integrated circuit chips to the structure, each integrated circuit chip being fastened to the front face of a respective one of the platforms;

placing the structure with the integrated circuit chips fastened thereto in a single mold cavity;

encapsulating the structure and the integrated circuit chips by filling the cavity with an encapsulant material; and separating the encapsulated structure into a plurality of packaged semiconductor devices, each of the packaged semiconductor devices including substantially vertical sidewalls.

56. The method according to claim 55, wherein the electrical connection leads include a group of electrical connection leads arranged along an edge of the central platform, the group including a central connection lead with a central branch that is substantially perpendicular to the edge of the central platform, a first end connection lead with a first branch that extends from the central platform at a positive acute angle relative to the central connection lead, and a second end connection lead with a second branch that extends from the central platform at a negative acute angle relative to the central connection lead.

57. The method according to claim 56, wherein the group of electrical connection leads further includes a second central connection lead disposed between the central connection lead and the first end connection lead and a third central connection lead disposed between the central connection lead and the second end connection lead.

58. The method according to claim 56, wherein a second group of the electrical connection leads are arranged along a second edge of the central platform, the second edge being perpendicular to and adjoining the edge, the second group including a second central connection lead that extends from the central platform at an acute angle relative to the second end connection lead.

59. The method according to claim 58, wherein the second central connection lead includes a second central branch that is substantially perpendicular to the second edge of the central platform and wherein the second group further comprises a third end connection lead that extends from the central platform at a positive acute angle relative to the second central connection lead and a fourth end connection lead that extends from the central platform at a negative acute angle relative to the second central connection lead.

60. The method according to claim 56, wherein the first branch of the first end connection lead is longer than the central branch of the central connection lead and the second branch of the second end connection lead is longer than the central branch of the central connection lead.

61. The method according to claim 60, wherein the first branch of the first end connection lead is the same length as the second branch of the second end connection lead.

62. The method according to claim 55, wherein the at least one of the leads has a chamfered edge and the platform has an indented edge.

63. The method according to claim 55, wherein, for at least one electrical connection lead, the branch extends across an entire width of electrical connection lead so that the recess fully separates the inner part from the outer part, wherein the branch extends along the length of the electrical connection lead between the inner part and the outer part.

* * * * *